United States Patent

Nakazawa et al.

[11] Patent Number: 5,851,924
[45] Date of Patent: Dec. 22, 1998

[54] METHOD FOR FABRICATING SEMICONDUCTOR WAFERS

[75] Inventors: Atsuo Nakazawa, Minamiashigara; Yuuichirou Mukai; Tomoaki Tajiri, both of Hiratsuka, all of Japan

[73] Assignee: Komatsu Electronic Metals Co., Ltd., Hiratsuka, Japan

[21] Appl. No.: 763,013

[22] Filed: Dec. 11, 1996

[51] Int. Cl.$^6$ .................................................. H01L 21/302
[52] U.S. Cl. .......................... 438/691; 438/471; 438/747; 438/928; 438/964; 438/974
[58] Field of Search ................................. 438/690, 747, 438/753, 928, 964, 974, 977, 471, 691

[56] References Cited

U.S. PATENT DOCUMENTS

| | | | |
|---|---|---|---|
| 3,905,162 | 9/1975 | Lawrence et al. | 438/974 |
| 4,144,099 | 3/1979 | Edmonds et al. | 148/1.5 |
| 4,276,114 | 6/1981 | Takano et al. | 438/691 |
| 5,429,711 | 7/1995 | Watanabe et al. | 216/89 |
| 5,447,890 | 9/1995 | Kato et al. | 438/691 |

*Primary Examiner*—Robert Kunemund
*Assistant Examiner*—Anita Alanko
*Attorney, Agent, or Firm*—Varndell Legal Group

[57] ABSTRACT

A method for fabricating a semiconductor wafer to reduce the number of processing steps and produce low-cost wafers in a short time is disclosed. The method involves surface grinding both the front surface and back surface of a single-crystal silicon wafer which has been sliced from a rod and chamfered. In the surface grinding step, the size numbers of abrasive grains are larger than #2000 for front surface grinding, and smaller than #600 for back surface grinding. The front surface is then chemical polished as a mirror surface which satisfies the requirement of a later photolithography step. Moreover, a deformation layer formed on the back surface of the semiconductor wafer is partially etched and left to provide an extrinsic gettering function. An epitaxial layer can be formed on the front surface to make the wafer an epitaxial wafer. The method of the present invention requires fewer process steps as compared with conventional methods, thereby reducing manufacturing time and cost.

3 Claims, 2 Drawing Sheets

METHOD FOR FABRICATING SEMICONDUCTOR WAFERS

BACKGROUND OF THE INVENTION

1. Field of the Invention

The present invention relates to fabrication of semiconductor wafers, and more specifically, to a method for fabricating a wafer or an epitaxial wafer for discrete devices.

2. Description of Related Art

Semiconductor devices are, in general, fabricated on a semiconductor wafer which is sliced from a single-crystal rod produced by the CZ or FZ method and then processed by steps such as lapping, polishing and heat treatment. According to their operating principles, the semiconductor devices can be separated into three categories including discrete devices, MOS ICs and bipolar ICs. The discrete devices are devices of low integrity and capacity, such as diodes, transistors thyristors and so on.

FIG. 3 illustrates the process steps for a conventional semiconductor wafer, which can or cannot be used to fabricate the discrete devices. The steps include slicing and chamfering a single-crystal silicon rod into wafers. The front and back surfaces of each wafer are lapped and a thickness of about 50–60 $\mu$m is removed. Then the wafer is chemical polished to remove a thickness of about 40–70 $\mu$m. In order to getter impurities and point defects, by using high-density micro-defects distributed in the semiconductor wafer, a heat treatment for intrinsic gettering (IG) is carried out on the semiconductor wafer. Or, polysilicon coating or sandblast processing to the back surface of the semiconductor wafer can be carried out to form a deformation layer as extrinsic gettering (EG) layer for gettering impurities and point defects. The semiconductor wafer, after the aforementioned processes, is held over a plate, and then the front surface of the semiconductor wafer is finally mirror-polished by chemical-mechanical polishing. A thickness of about 10–20 $\mu$m of the wafer is removed by the chemical-mechanical polishing, thus a total thickness of about 120–130 $\mu$m in a thickness of as-sliced wafer is removed after all processes. The semiconductor wafer is finally cleaned. Moreover, an epitaxial layer can be formed over the cleaned wafer to fabricate an epitaxial wafer.

Unlike the wafers for MOS ICs and bipolar ICs, the wafer for discrete devices, when a photolithography step to form patterns is carried out, does not require a perfect mirror surface due to the lower integrity of the discrete devices. If the chemical-mechanical polishing step in FIG. 3 is omitted, however, the front surface of the wafer will be too rough to fabricate the discrete devices by only lapping and chemical polishing the wafer surfaces. Therefore, the chemical-mechanical polishing step is required even for the fabrication of discrete devices. Moreover, in order to getter defects and impurities, both of the heat treatment for the IG effect and the polysilicon coating (or sandblast) for the EG effect are carried out. That is, the conventional method for processing the wafer requires many steps in which some are not practical for the wafer for discrete devices. Therefore, the time and cost of discrete device fabrication are both increased due to the wafer processing.

SUMMARY OF THE INVENTION

Accordingly, the present invention provides a method for fabricating a semiconductor wafer for discrete devices to reduce the number of processing steps and produce low-cost wafer in a short time.

In the present invention, the method for fabricating a semiconductor wafer is characterized in that the front surface and back surface of the semiconductor wafer are both processed by surface grinding and chemical polishing. In the surface grinding step, the size numbers of abrasive grains are larger than #2000 for front surface grinding, and smaller than #600 for back surface grinding. Moreover, a deformation layer formed in the front surface of the semiconductor wafer by surface grinding is completely removed in the chemical polishing step, while another deformation layer formed in the back surface by surface-grinding is left in the chemical polishing step.

The aforementioned method changes the grain sizes for front and back surface grinding, thus forming appropriate roughness for the front and back surface of the wafer. Therefore, after chemical polishing the surface ground wafer, the surface conditions of front surface of the wafer are suitable for photolithography. Moreover, the back surface of the wafer has the EG effect, since deformation layer formed in the back surface by surface-grinding is left after the chemical polishing step. Accordingly, the chemical-mechanical polishing step can be omitted, and the wafer is fabricated with fewer process steps and at lower cost.

DETAILED DESCRIPTION OF THE INVENTION

Figure 1:
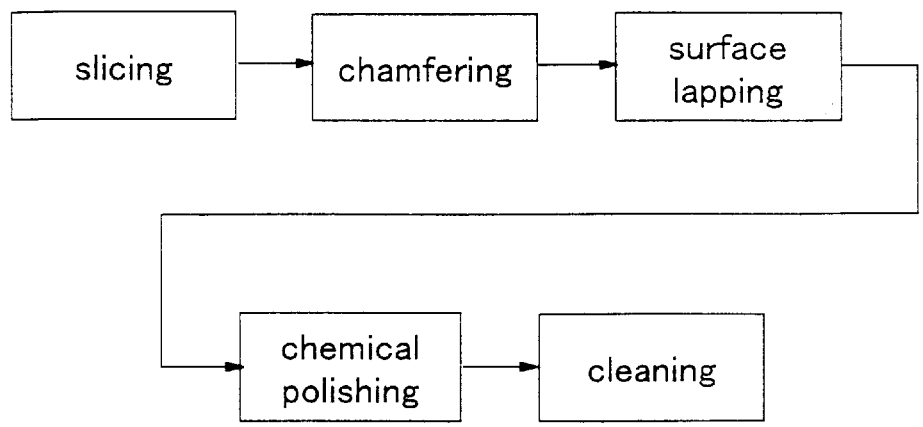
FIG. 1 illustrates the process steps for fabricating a semiconductor wafer for discrete devices.

The preferred embodiment of the present invention will be described in accompaniment with the drawings. Referring to FIG. 1, a single-crystal silicon wafer is sliced from a rod and is chamfered. The front surface and the back surface of the wafer is surface ground. In the surface grinding step, the front surface is finely ground by abrasive grains whose size numbers are larger than #2000, according to the Japanese Industrial Standard (JIS), and the back surface is roughly ground by abrasive grains whose size numbers are smaller than #600 (JIS). The total thickness of the wafer removed in the surface grinding step is about 40 $\mu$m. Then the front and back surfaces of the wafer are chemical polished to a thickness of about 10–20 $\mu$m. Therefore, the front surface is a mirror surface as the deformation layer formed by surface grinding is completely removed. Moreover, the deformation layer in the back surface of the wafer can be partially etched so that a part of the deformation layer is left. The wafer is finally cleaned. Furthermore, an epitaxial layer can be formed on the front surface of the wafer for discrete devices.

Figure 2:
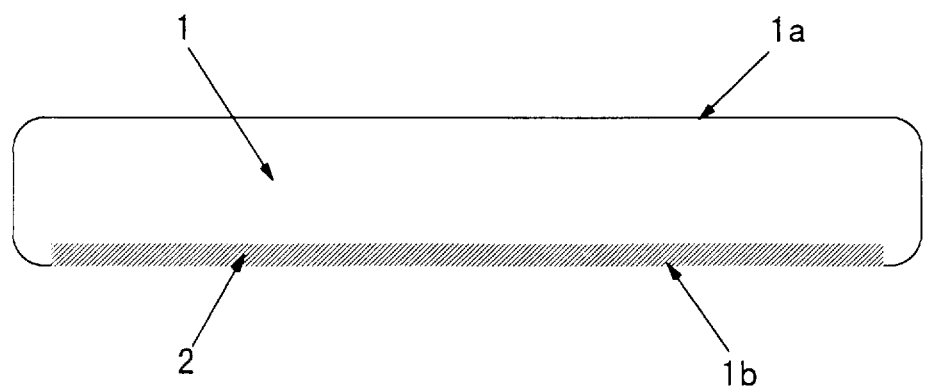
FIG. 2 is a cross-sectional view of the semiconductor wafer fabricated by the method of the present invention.
Figure 3:
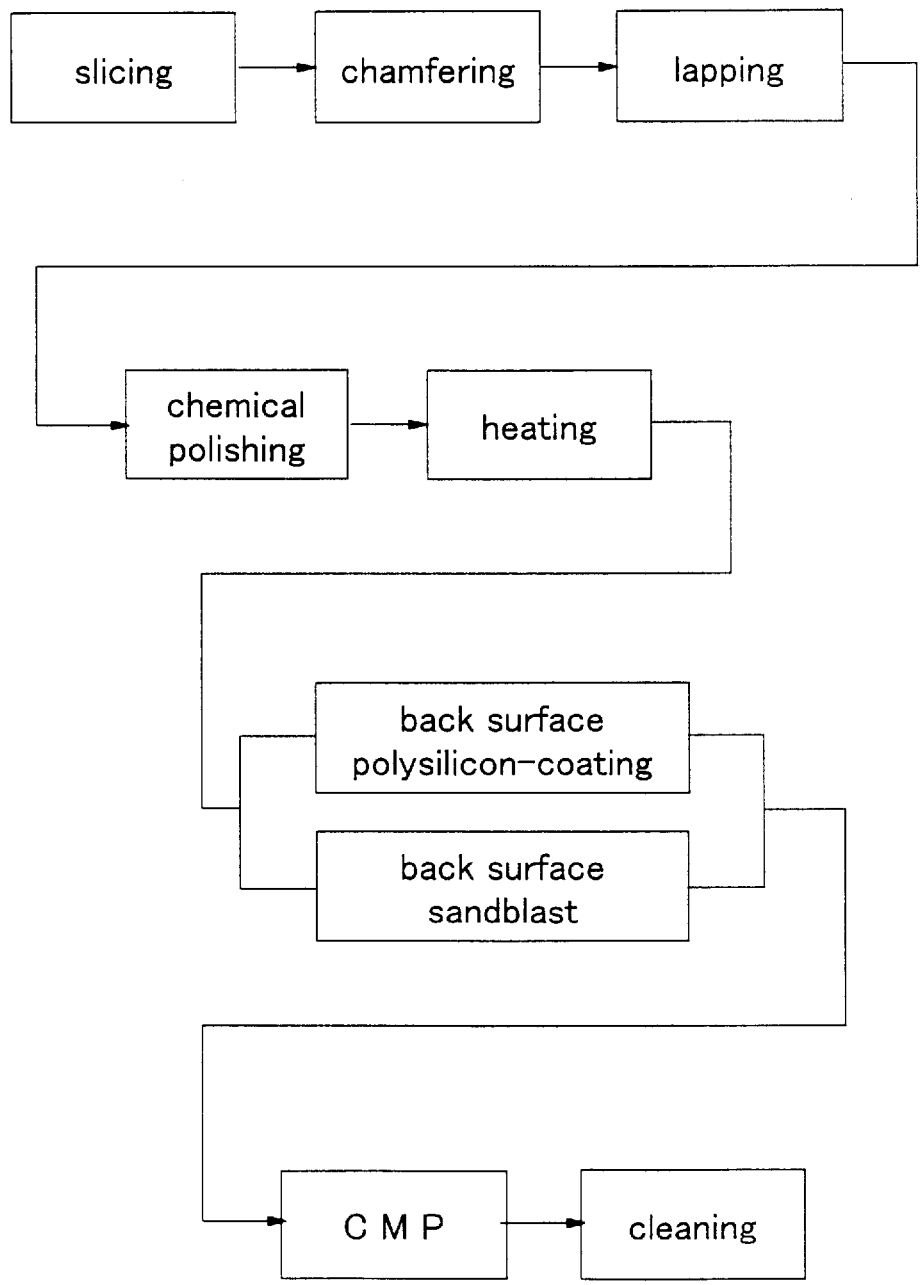
FIG. 3 illustrates conventional process steps for fabricating a semiconductor wafer.

A cross-sectional view of the wafer fabricated according to the present embodiment is illustrated in FIG. 2. In the figure, the front surface 1a of the semiconductor wafer 1 is an almost mirror surface due to the chemical polishing step. The roughness of the front surface 1a satisfies the requirement of the photolithography step for fabricating discrete devices. On the other hand, the remained deformation layer 2 in the back surface 1b of the semiconductor wafer 1 has the EG effect.

Since the present invention changes the grain sizes of abrasive grains for front and back surface grinding, the back surface of the wafer is rough, and the deformation layer which has the EG effect remains therein. Therefore, no additional process for the EG effect is required. Moreover, the discrete devices, unlike MOS ICs and bipolar ICs, need only the EG effect as gettering, due to their low integrity and simple structure. Furthermore, the front surface of the present invention, which has been surface ground, has a better surface condition than that of conventional lapped wafer surfaces. That is, the front surface of the present invention is suitable for photolithography without requiring chemical-mechanical polishing step.

According to the aforementioned description, the present invention fabricates a wafer for discrete devices and fabricates this wafer as an epitaxial wafer by surfacing grinding the wafer before chemical polishing the wafer. The front surface of the wafer is finely ground, whereas the back surface is roughly ground. After the chemical polishing step, the front surface of the wafer satisfies the requirement of photolithography for fabricating the devices, without chemical-mechanical polishing. Moreover, the deformation layer in the back surface of the wafer has the EG effect. Therefore, the present invention provides advantages as follows.

1. The number of process steps is reduced as compared with the conventional method, thereby shortening the lead time by 20%, and reducing manufacturing cost.

2. One half of the cost for grinding and polishing the wafer can be saved as compared with the conventional method, thereby reducing the material consumption during fabrication.

3. Less lapping and chemical-mechanical polishing processes to the wafer is carried out, thereby reducing the wafer thickness variation and increasing the flatness of the wafer.

What is claimed is:

1. A method for fabricating a semiconductor wafer, which comprises the steps of
   slicing a semiconductor ingot into semiconductor wafers;
   chamfering the semiconductor wafers;
   grinding a front surface and back surface of the semiconductor wafer by using different grain sizes respectively for the front and back surfaces and chemical polishing so that the front surface has a surface roughness where the deformation layer formed by the front surface grinding is removed, and the back surface has a surface roughness where the deformation layer formed by the back surface grinding remains after the chemical polishing.

2. The method as claimed in claim 1, wherein size numbers of abrasive grains are larger than #2000 for front surface-grinding, and smaller than #600 for back surface grinding.

3. The method as claimed in claim 1, wherein a deformation layer formed on the front surface of the semiconductor wafer by the surface grinding is removed thoroughly in the chemical polishing, whereas the deformation layer formed on the back surface by the surface grinding remains after the chemical polishing so that the front surface has an appropriate roughness for photolithography and the back surface has an EG effect.

* * * * *